US009688527B2

(12) United States Patent
Frey et al.

(10) Patent No.: US 9,688,527 B2
(45) Date of Patent: Jun. 27, 2017

(54) MICROMECHANICAL COMPONENT AND METHOD FOR PRODUCING A MICROMECHANICAL COMPONENT

(71) Applicant: Robert Bosch GmbH, Stuttgart (DE)

(72) Inventors: Jens Frey, Filderstadt (DE); Jochen Reinmuth, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 323 days.

(21) Appl. No.: 14/468,214

(22) Filed: Aug. 25, 2014

(65) Prior Publication Data

US 2015/0053001 A1 Feb. 26, 2015

(30) Foreign Application Priority Data

Aug. 26, 2013 (DE) .......................... 10 2013 216 898

(51) Int. Cl.
*B81B 3/00* (2006.01)
*G01P 3/14* (2006.01)
(Continued)

(52) U.S. Cl.
CPC .......... *B81B 3/0027* (2013.01); *B81B 3/0086* (2013.01); *G01C 19/574* (2013.01);
(Continued)

(58) Field of Classification Search
CPC G01C 19/5755; G01C 19/574; B81B 3/0086; B81B 2203/04; G01P 2015/082; G01P 2015/0805
(Continued)

(56) References Cited

U.S. PATENT DOCUMENTS 5,335,544 A * 8/1994 Wagner ............... G01P 15/0802
73/514.32
8,336,382 B2 * 12/2012 Classen ............... G01P 15/0802
73/514.32
(Continued)

*Primary Examiner* — Michael A Lyons
*Assistant Examiner* — Suman K Nath
(74) *Attorney, Agent, or Firm* — Norton Rose Fulbright US LLP; Gerard Messina (57) ABSTRACT

A micromechanical component is provided having a substrate having a main plane of extension, a first electrode extending mainly along a first plane in planar fashion, a second electrode extending mainly along a second plane in planar fashion, and a third electrode extending mainly along a third plane in planar fashion, the first, second, and third plane being oriented essentially parallel to the main plane of extension and being situated one over the other at a distance from one another along a normal direction that is essentially perpendicular to the main plane of extension, the micromechanical component having a deflectable mass element, the mass element being capable of being deflected both essentially parallel and also essentially perpendicular to the main plane of extension, the second electrode being connected immovably to the mass element, the second electrode having, in a rest position, a first region of overlap with the first electrode along a projection direction essentially parallel to the normal direction, and having a second region of overlap with the third electrode along a projection direction parallel to the projection direction, the mass element extending in planar fashion mainly along the third plane, the mass element having a recess that extends completely through the mass element, extending in planar fashion along the third plane and parallel to the normal direction, the third electrode being situated at least partly in the recess.

12 Claims, 12 Drawing Sheets

(51) Int. Cl.
*G01P 3/44* (2006.01)
*G01C 19/574* (2012.01)
*G01C 19/5755* (2012.01)

(52) U.S. Cl.
CPC ............ *G01C 19/5755* (2013.01); *G01P 3/14* (2013.01); *G01P 3/44* (2013.01); *B81B 2203/04* (2013.01)

(58) Field of Classification Search
USPC .............. 73/504.12, 504.02, 504.04, 504.14, 73/514.32
See application file for complete search history.

(56) References Cited

U.S. PATENT DOCUMENTS 8,925,384 B2 * 1/2015 McNeil ................. G01P 15/125
73/504.12
2009/0255336 A1 * 10/2009 Horning ............. G01C 19/5719
73/504.12

* cited by examiner

MICROMECHANICAL COMPONENT AND METHOD FOR PRODUCING A MICROMECHANICAL COMPONENT

FIELD OF THE INVENTION

The present invention is based on a micromechanical component.

BACKGROUND INFORMATION

Such micromechanical components are generally known. For example, micromechanical rotational rate sensors are generally known that are configured to detect a rotational movement of the rotational rate sensor. In addition, linearly oscillating vibration gyroscopes are generally known; in these rotational rate sensors, parts of a movable structure of the rotational rate sensors are driven to a drive oscillation along a drive direction. As a function of a rotational rate about an axis of rotation, perpendicular to the drive direction, of the rotational rate sensor, Coriolis forces are produced that bring about a detection oscillation of parts of the sensor structure perpendicular to the drive direction and to the axis of rotation. In addition, detection electrodes are situated in the sensor structure that detect the detection oscillation.

A coupling of signals from the drive oscillation into the detection electrodes is generally referred to as quadrature. Quadrature signals are in particular signals that occur at the detection electrodes even when the rotational rate sensor is not acted on with a rotational rate. Typical causes for the occurrence of quadrature signals are parameter scatterings in the production process, which for example can be caused by spring structures that are not situated exactly parallel to one another, or deviations in the structural width of spring structures. In this way, for example different spring rigidities are produced that result in particular in a coupling of the drive oscillation into the detection oscillation, thus causing a quadrature signal.

Disadvantageously, the quadrature compensating forces are a function of the deflection along the detection direction, in such a way that quadrature compensating forces can also change as a function of the deflection along the direction of detection. In this way, the vibration sensitivity of the sensor system to external disturbing excitations is increased. In addition, the effective resonance frequency of the sensor system becomes a function of the operating point, which is undesirable.

SUMMARY

An object of the present invention is therefore to provide a micromechanical component and an improved method for producing a micromechanical component, the quadrature compensation being improved and a micromechanical component being fashioned in a comparatively space-saving manner.

The micromechanical component according to the present invention, and a method for producing a micromechanical component according to the present invention, have the advantage, in comparison with the existing art, that through the situation of the third electrode at least partly in the recess of the mass element, a comparatively space-saving micromechanical component is provided, while nonetheless the quadrature compensation can still be improved compared to the existing art. In particular, both the extension of a quadrature compensation structure made up of a first electrode, second electrode, third electrode, and recess is comparatively space-saving, both along a lateral direction parallel to the main plane of extension and also parallel to the normal direction.

Preferably, the compensation electrodes, i.e. for example the first electrode and the third electrode, are situated both under the movable structure, i.e. for example between the second electrode and the substrate, and also over the movable structure, i.e. for example over the second electrode in a direction oriented parallel to the normal direction, from the substrate to the second electrode. Through the situation of the compensation electrodes under and over the second electrode, also designated movable structure, it is advantageously possible that, given a disturbance in the detection direction, the overall force of the first and second compensating force produced by the compensation electrodes is, to a first approximation, not modified. In addition, it is advantageously possible to make the compensation electrodes comparatively small at the same voltage, i.e. for example to fashion them with a small extension parallel to the main plane of extension. In particular, the compensation electrodes are configured symmetrically. Here, the symmetry relates in particular to an electrode surface, i.e. for example a surface, extending parallel to the main plane of extension, of the first, second, and/or third electrode, and/or to the overlap, i.e. the first and/or second overlap region, and/or to a distance between the first and second electrode and between the third and second electrode. Preferably, the movable structure, or second electrode, in the regions of the compensation structure, i.e. for example in the region of the recess, is formed entirely or partially in a second layer having the second plane. In addition, in particular the upper electrode, i.e. the third electrode, is formed entirely or partially in a layer having the third plane. Preferably, for the compensation of the quadrature signals the first electrode, the second electrode, the third electrode, and the recess are situated and/or fashioned in such a way that during the drive oscillation of the mass element temporally varying electrostatic compensating forces are produced on the second electrode, and thus on the mass element, that are oriented in such a way that in particular they counteract a deflection of the mass element along the detection direction during the drive oscillation, in order in this way to compensate the quadrature signal.

Preferably, the micromechanical component is a rotational rate sensor, the rotational rate sensor being configured in order to detect a rotational rate about an axis of rotation that is essentially parallel to the main plane of extension. Preferably, in this case the deflectable mass element is a Coriolis element of the rotational rate sensor. Preferably, the mass element is capable of being deflected essentially parallel to the main plane of extension, i.e. for example the mass element is capable of being driven, particularly preferably in linear and deflectable fashion, along a drive plane essentially parallel to the main plane of extension. In addition, the mass element is also capable of being deflected along a normal direction essentially perpendicular to the main plane of extension, i.e. for example the mass element is capable of being deflected in a direction of detection parallel to the normal direction, in particular as a function of the drive movement and a rotational movement of the rotational rate sensor about the axis of rotation. Preferably, the first, second, and third plane along a projection direction essentially parallel to the normal direction are situated one over the other at a distance from one another in such a way that the first, second, and third electrode are electrically insulated from one another. Preferably, here an electrode or mass element extending mainly along a plane in planar fashion means that the electrode or the mass element has a main plane of extension, the main plane of extension being situated parallel to the plane and the electrode or the mass element lying in the plane and/or the plane intersecting the electrode or the mass element. Preferably, the micromechanical component has a quadrature compensation structure that includes the first electrode, the second electrode, and the third electrode. Preferably, the first electrode is also designated first compensation electrode and the third electrode is also designated second compensation electrode. Preferably, the first electrode, the second electrode, and the third electrode are configured for quadrature compensation during the detection, i.e. for example the first electrode is configured for the production of a compensating force acting on the second electrode essentially in the direction of the first electrode, and the third electrode is configured for the production of a further compensating force acting on the second electrode essentially in the direction of the third electrode. Preferably, the compensating force and the further compensating force are provided for the compensation of a quadrature force acting on the mass element during the drive oscillation. In particular, the quadrature force results in a deflection of the mass element along the normal direction when the micromechanical component is situated essentially in an inertial system and essentially no potential difference is present between the compensation electrodes and the second electrode. In addition, the regions of overlap are preferably a function of deflection, so that the compensating forces are also a function of deflection. In particular, in the rest position the micromechanical component has only a comparatively small overlap between the moved mass, i.e. for example the second electrode, and an electrode, i.e. for example the first and/or third electrode. Thus, in addition to the compensating forces configured symmetrically to one another, the ratio of a force varying with the movement to the force independent of the movement can be further improved.

In particular, rest position of the mass element, or of a seismic mass or mass unit formed from the mass element and second electrode, means that the seismic mass is in an equilibrium of forces, i.e. for example if no outer acceleration or rotational rate is present and/or the mass element, also referred to as seismic mass, is not driven to the drive movement. The rest position is in particular determined essentially by the effective spring rigidity of the seismic mass, which is suspended in spring-elastic fashion on the substrate so as to be capable of oscillation.

Preferably, the third electrode is situated at least partly in the recess, i.e. the third electrode extends parallel to the normal direction along a third height essentially smaller than or essentially equal to an extension of the recess parallel to the normal direction. Preferably, the recess extends, parallel to the normal direction, completely through the mass element and mainly essentially along the third plane, i.e. for example the second electrode is essentially connected immovably to the mass element in such a way that the second electrode and the recess parallel to the normal direction have a further region of overlap, the second electrode extending mainly in the further region of overlap.

According to a preferred development, it is provided that the second electrode has, parallel to the normal direction, a first distance from the first electrode and a second distance from the third electrode, the first distance and the second distance being essentially equally large. In this way, it is advantageously possible that when there is a disturbance, for example a quadrature force on the mass element parallel to the detection direction, the overall compensating force produced by the compensation electrodes does not change, to a first approximation.

According to a further preferred development, it is provided that the second electrode is made self-supporting. In this way, it is advantageously possible to situate the third electrode in the recess, thus reducing the space requirement.

According to a further preferred development, it is provided that the first region of overlap and the second region of overlap are essentially equally large and/or are situated alongside one another along a projection direction parallel to the normal direction, and/or are mirror-symmetrical relative to an axis of symmetry essentially parallel to the second plane. In this way, it is advantageously possible to provide a quadrature compensation system, such that on average no basic deflection is produced and compensating forces on the second electrode or the mass element are produced that are on average symmetrical, i.e. are oppositely oriented and equal in magnitude.

According to a further preferred development, it is provided that a first layer, applied on the substrate, essentially includes the first electrode, and a second layer, applied on the first layer, essentially includes the second electrode, a third layer applied on the second layer essentially including the third electrode, and the mass element, the recess, and the third electrode being formed at least partly or completely from the same third layer. In this way, it is advantageously possible to provide a particularly space-saving micromechanical component having a comparatively small quadrature compensation structure, the signal quality of a detection signal nonetheless being comparatively good. Preferably, the second electrode is fashioned as a planar electrode from the second layer, in particular a polysilicon layer. Preferably, the first, second, and third layers are separated by oxide layers, which also act as sacrificial layers, and can in particular be exposed through etching processes. In particular, for this purpose access holes are created for the etching access of a gaseous etching medium. Further preferably, electrically conductive and/or mechanical connections are situated between the conductive layers for the electrical contacting of the components structured in the layers, for example for the production of an electrically conductive connection between the mass element and the second electrode.

According to a further preferred development, it is provided that the first electrode and the third electrode are connected in stationary fashion to the substrate, the recess having a main direction of extension, the third electrode extending in oblong fashion mainly along an electrode direction parallel to the main direction of extension, essentially inside the recess. In this way, it is advantageously possible to provide a quadrature compensation structure having a particularly low height parallel to the normal direction.

According to a further preferred development, it is provided that the micromechanical component has a further first electrode and a further third electrode, the first electrode and further first electrode being situated alongside one another and electrically insulated from one another along a projection direction parallel to the normal direction, the third electrode and further third electrode being situated alongside one another and electrically insulated from one another along a projection direction parallel to the normal direction, the further third electrode extending, in oblong fashion, mainly along a further electrode direction essentially parallel to the electrode direction, essentially inside the recess. In this way, it is advantageously possible to improve the quadrature compensation.

According to a further preferred development, it is provided that the micromechanical component has a detection electrode that extends in planar fashion mainly along the second plane, the detection electrode being configured for the capacitive detection of a deflection of the seismic mass along the normal direction, the first electrode being situated along a projection direction parallel to the normal direction, at least partly between the detection electrode and the substrate. In this way, it is advantageously possible to obtain a comparatively good detection signal, because the detection electrode can be made comparatively large, and thus the capacitance of the detection structure made up of the mass element and detection electrode can be increased.

According to a further preferred development, it is provided that the third layer has a layer height that extends parallel to the normal direction, the mass element, the recess, and/or the third electrode extending completely along the layer height. In this way, it is advantageously possible to provide a quadrature compensation structure having a particularly low height parallel to the normal direction.

According to a further preferred development, it is provided that the first electrode and the third electrode are quadrature compensation electrodes, the first electrode being configured for the production of a compensating force acting on the second electrode essentially in the direction of the first electrode, the third electrode being configured for the production of a further compensating force acting on the second electrode essentially in the direction of the third electrode. In this way, it is advantageously possible to provide a quadrature compensation system such that on average no basic deflection is produced, and compensating forces on the second electrode or the mass element are produced that are on average symmetrical, i.e. oppositely oriented and having the same magnitude. Preferably, the compensating force is opposite to and parallel to the further compensating force. Preferably, the magnitude of the compensating force is essentially equal to the magnitude of the further compensating force.

According to a further development of the method according to the present invention, it is provided that in the third production step the third layer is fashioned in such a way that the third layer has a layer height extending parallel to the normal direction, the mass element, the recess, and/or the third electrode being fashioned in such a way that the mass element, the recess, and/or the third electrode extend completely along the layer height. In this way, it is advantageously possible to provide a quadrature compensation structure having a particularly low height parallel to the normal direction.

Exemplary embodiments of the present invention are shown in the drawings and are explained in more detail in the following description.

DETAILED DESCRIPTION

In the various Figures, identical parts have always been provided with identical reference characters, and are therefore as a rule only named or mentioned once.

Figure 1:
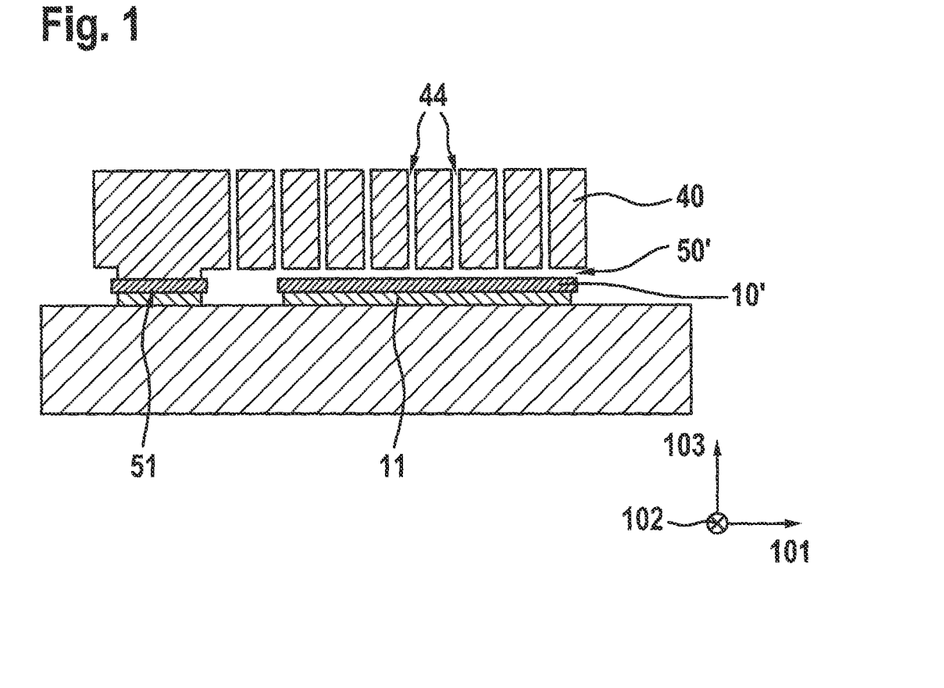
FIGS. 1 through 5 show a micromechanical component according to various specific embodiments of the present invention, in a schematic front view.
Figure 2:
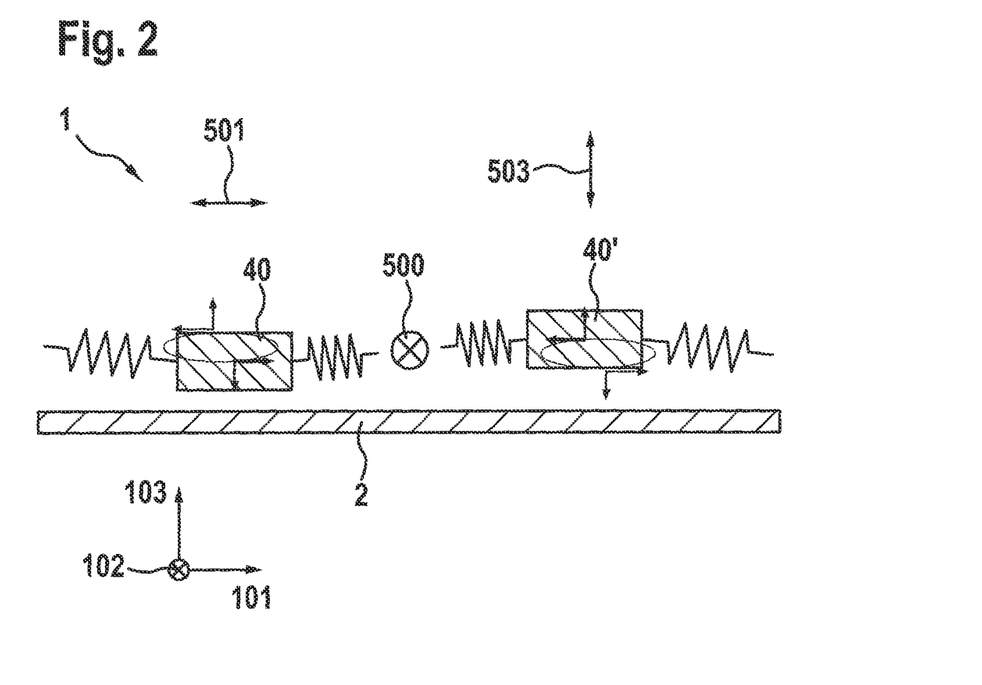
Figure 3:
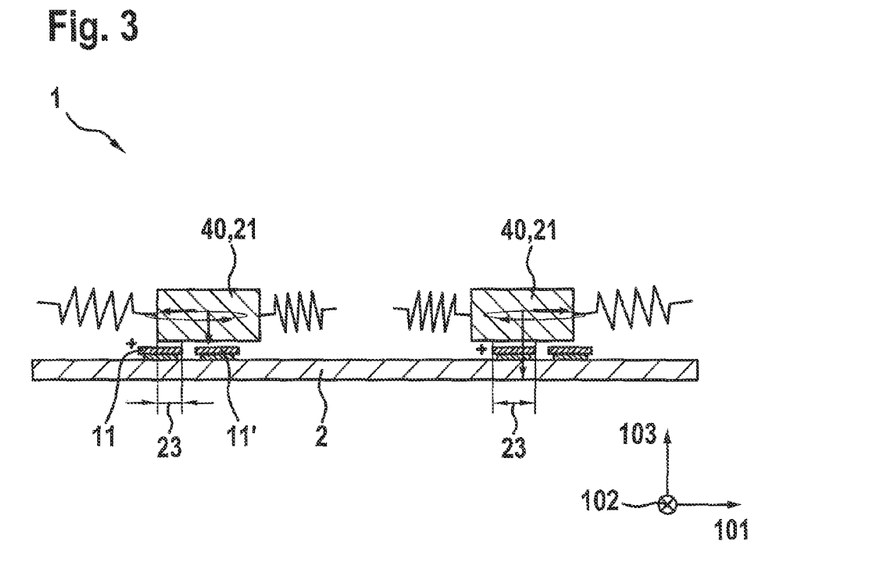
Figure 4:
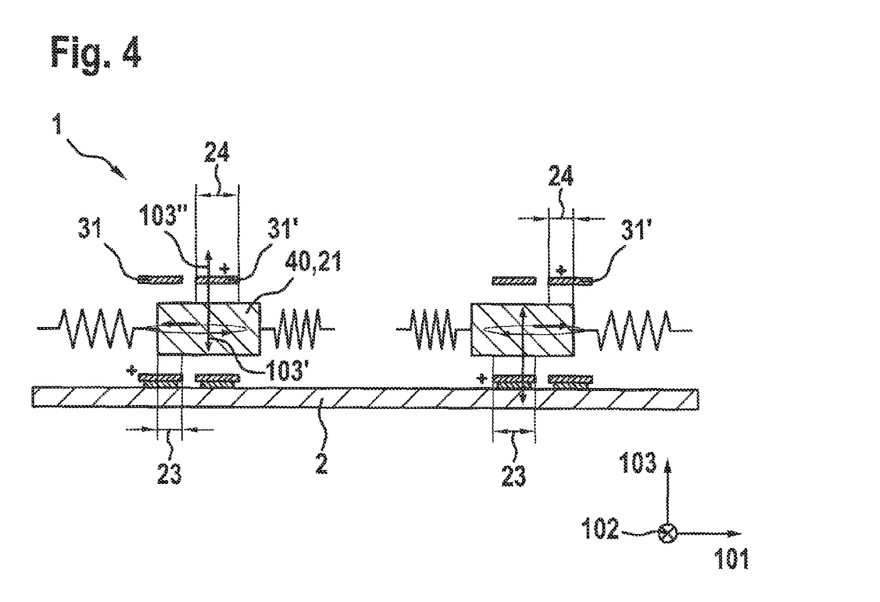
Figure 5:
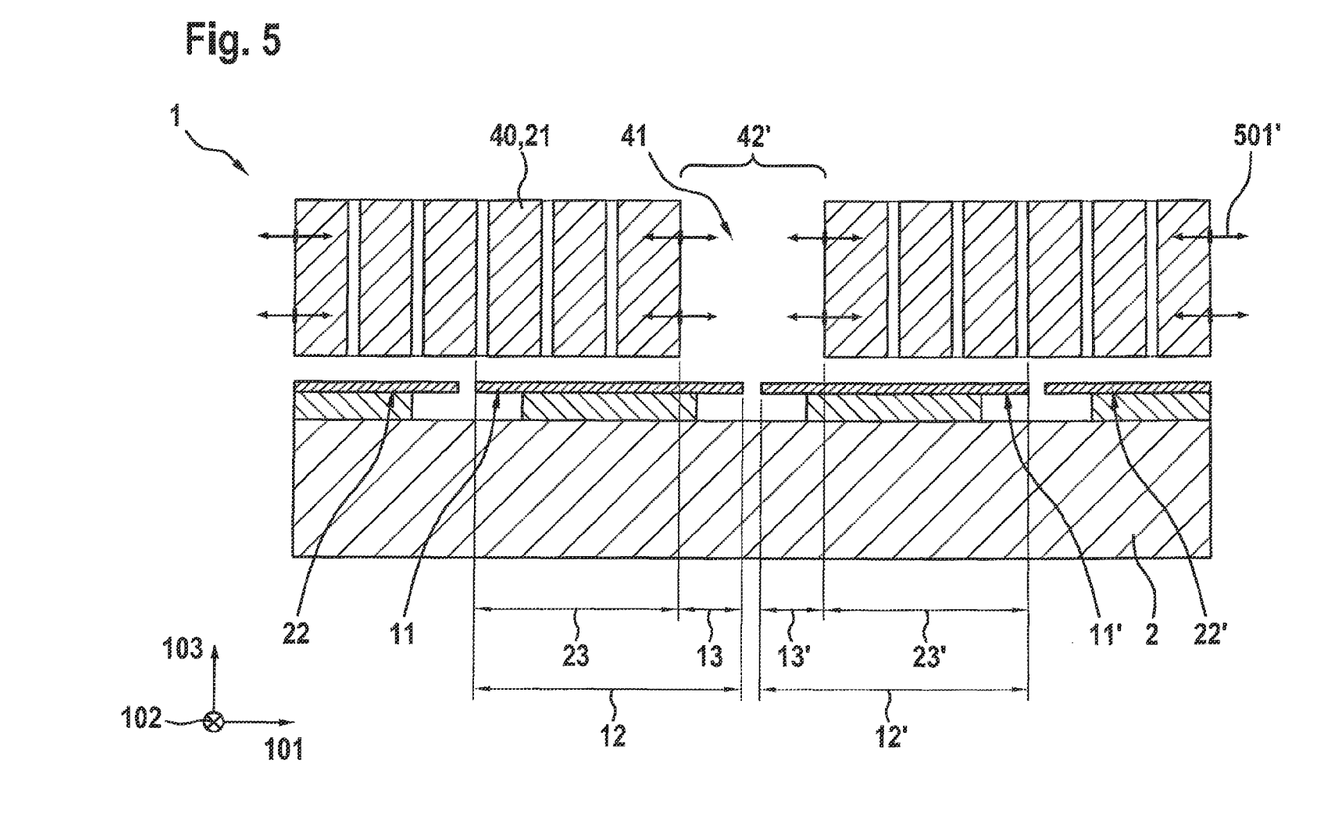

FIG. 1 shows a micromechanical component 1 according to a specific embodiment of the present invention in a schematic sectional view. Micromechanical component 1 here has a movable mass element 40, in particular a silicon structure 40, that is capable of being deflected along an X direction 101, i.e. for example can be driven to execute a drive oscillation. In addition, mass element 40 is capable of being deflected along a Z direction 103 perpendicular to X direction 101. Here, the Z direction is also referred to as normal direction 103 or detection direction 103, normal direction 103 essentially being oriented perpendicular to a main plane of extension 100 of a substrate 2 (see FIG. 5) of micromechanical component 1. Preferably, a detection deflection or detection movement of mass element 40 is detected as a function of a measured change in capacitance. Preferably, movable mass element 40 is produced by an etching method, trenches 44 being produced in a silicon layer 30 with a high aspect ratio. Here, preferably a sacrificial layer 50 is removed under the comparatively thick layer 30 of silicon. In this way, it is advantageously possible to expose movable silicon structure 40, or mass element 40. Preferably, under movable silicon structure 40 there is situated a thin polysilicon layer 10 as planar electrode 11, 11', polysilicon layer 10 being fashioned as a bonding 51 for movable or fixed silicon structures 40, or as electrode 11, 11', under the movable, comparatively thick silicon layer 30, or as a conductive means or printed conductor 14, 14'. FIG. 2 shows a micromechanical element 1 according to a specific embodiment of the present invention in a schematic side view. Here, micromechanical component 1 is fashioned as rotational rate sensor 1, mass element 40 and a further mass element 40 being situated on substrate 2 in such a way that the two mass elements 40, 40' are capable of being driven to an opposite-phase drive oscillation along a drive plane 501. Here, rotational rate sensor 1 is moved with a rotational rate about an axis of rotation 500, so that as a function of a rotational movement about axis of rotation 500 and as a function of the drive moment along drive plane 501, mass element 40 and further mass element 40' are deflected in opposed, parallel detection directions 503, parallel to normal direction 103. As a function of parameter scattering in the production process, a deflection in detection direction 503 can also occur when no rotational rate is present. For the compensation of the quadrature forces acting on mass element 40, 40', compensation electrodes are provided that are configured for quadrature compensation. In FIG. 3, a first electrode 11 and a further first electrode 11' are situated between mass element 40 and substrate 2, along a projection direction parallel to normal direction 103, first electrode 11 extending beyond mass element 40 parallel to X direction 101, and having, along a projection direction, a first region of overlap 23 with movable mass element 40. For example, first electrode 11, or further first electrode 11', is charged with an electrical direct voltage, represented here by the "+" symbol. This produces a temporally changing compensating force or a constant compensating force on the mass element parallel to the normal direction, in particular in the direction of first electrode 11. In particular, two first electrodes 11 and/or further first electrodes 11' are provided in order to compensate quadrature forces of two mass elements 40 coupled to one another. In FIG. 4, a micromechanical component 1 is shown, mass element 40—which here has a second electrode 21, or is fashioned as a second electrode 21—being situated between first electrode 11 and a third electrode 31. Here, first electrode 11 is situated under third electrode 31, along a projection direction parallel to normal direction 103. Here, first electrode 11 is configured in order to produce a compensating force (shown by arrow tips 103') acting on second electrode 21, or mass element 40, essentially in the direction of first electrode 11, third electrode 31 being configured to produce a further compensating force (shown by arrow tips 103") acting on second electrode 21, or movable mass 50, essentially in the direction of third electrode 31. FIG. 5 shows a micromechanical component 1 that essentially corresponds to the specific embodiment shown in FIG. 3. Here, a first electrode 11 and a further first electrode 11' are situated on substrate 2, between substrate 2 and deflectable mass element 40, which here in particular is made electrically conductive and in this case can also for example be referred to as second electrode 21. Preferably, micromechanical component 1 is produced using an oxide sacrificial layer method, so that a first, or further first, electrode surface of first, or further first, electrode 11' has a first electrode width 12 extending along a first plane 10', and the further first electrode has a further first electrode width 12', each having a minimum width that in particular is not fallen below, because first, or further first, electrode 11, 11' otherwise would be underetched and in particular would not be bound to substrate 2, or would be inadequately bound thereto. Here, deflectable mass element 40 has a recess 41 having a recess width 42' extending parallel to X direction 101. Here, recess width 42' is essentially equal to a twofold deflection amplitude 501', extending parallel to X direction 101, of deflectable mass element 40. Here, first, or further first, electrode 11, 11' each have, along a projection direction parallel to Z direction 103, a first, or further first, region of overlap 23, 23' with deflectable mass 40. In addition, first, or further first, electrode 11, 11' has a first, or further first, electrode partial surface 13, 13' extending parallel to first plane 10', overlapping with recess 41 along a projection direction parallel to normal direction 103. In order to achieve a good quadrature compensation, preferably both the first, or further first, region of overlap and also the first, or further first, electrode partial surface 13, 13' extends over a greater, or at least equal, length than deflection amplitude 501' of movable mass 40. First, or further first, electrode with 12, 12' extends, for example as a result of production, parallel to the X direction over a length that is greater than twice the deflection amplitude 501', so that the quadrature compensation structure is comparatively large in the specific embodiment shown in FIG. 5.

Figure 6:
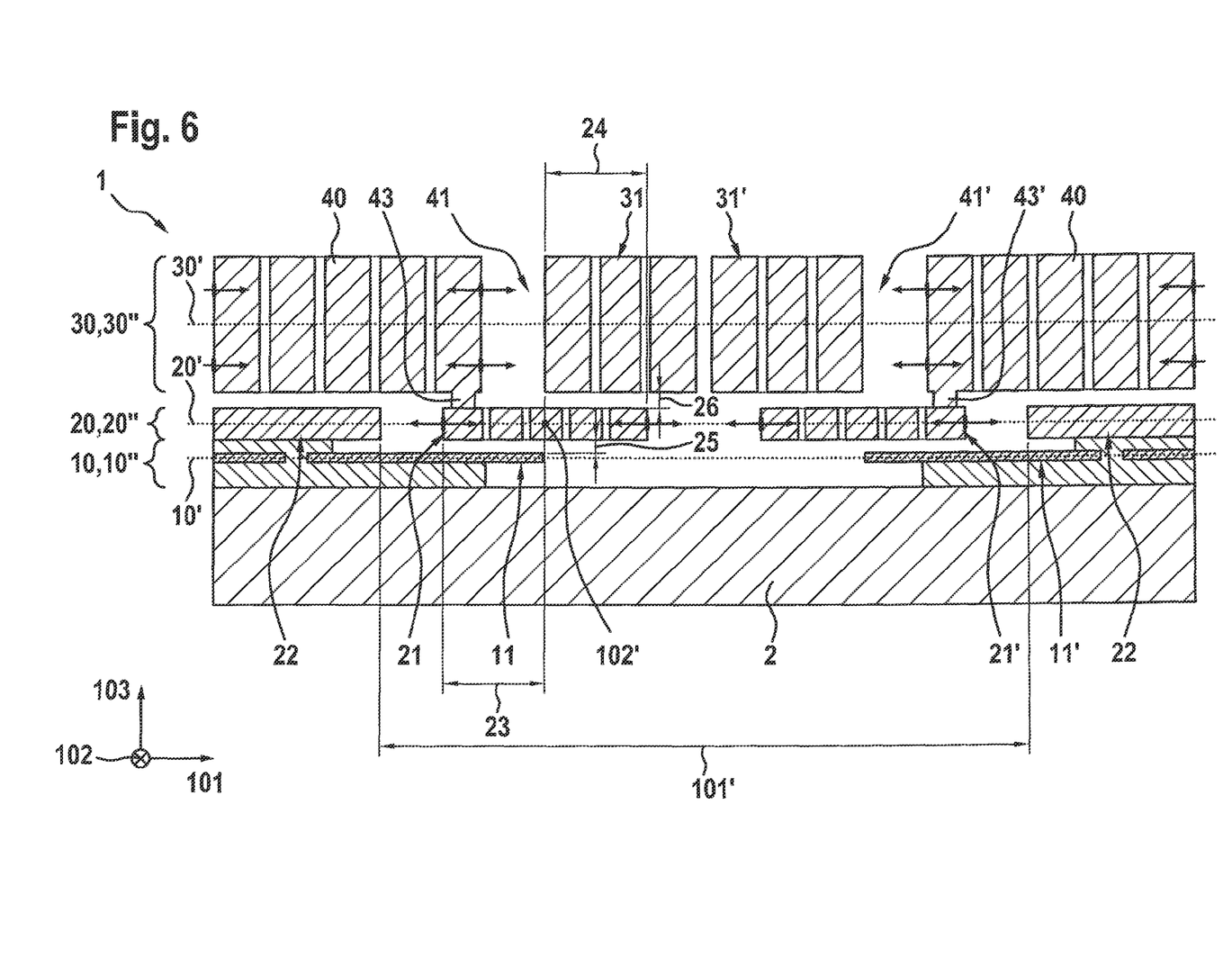
FIGS. 6 through 7 show a micromechanical component according to various specific embodiments of the present invention in a schematic side view.

FIG. 6 shows a micromechanical component 1 according to a specific embodiment of the present invention, in a schematic side view. Here, component 1 has a substrate having a main plane of extension 100 essentially parallel to X direction 101 and to Y direction 102, or essentially perpendicular to a Z direction 103, also designated normal direction 103. Here, micromechanical component 1 is in particular fashioned as rotational rate sensor 1, and has a quadrature compensation system 11, 11', 21, 21', 31, 31', 41, quadrature compensation system 11, 11', 21, 21', 31, 31', 41 extending over a comparatively small width 101' parallel to the X direction.

Here, on the substrate there are situated a first electrode 11 and a further first electrode 11', the first and further first electrode 11' extending mainly along a first plane 10' in a first layer 10 of component 1, in planar fashion.

Preferably, component 1 additionally has a second electrode 21, a further second electrode 21, and a detection electrode 22, the second electrode, further second electrode, and/or detection electrode 22 extending along a second plane 20', essentially in planar fashion. Here, second electrode 21, further second electrode 21, and detection electrode 22 are formed, in particular partly or completely, in a second layer 20".

Preferably, detection electrode 22 overlaps first and/or further first electrode 11, 11', in each case along a projection direction parallel to normal direction 103.

Component 1 further has a deflectable element 40, a third electrode 31, and a further third electrode 31', deflectable element 40, third electrode 31, and further third electrode 31' each extending in planar fashion mainly along a third plane 30' essentially parallel to main plane of extension 100, and in particular being formed partially or completely in a third layer 30 of component 1. Here, mass element 40 has a recess 41, the recess extending completely through mass element 40 along a projection direction parallel to normal direction 103. Preferably, an extension of recess 41 along the direction of projection is essentially equal to a third layer height 30" of third layer 30. Preferably, in addition an extension of the mass element and/or of third electrode 31 and/or of further third electrode 31' along the projection direction is essentially equal to third layer height 30" of third layer 30. Preferably, first layer 10 has a first layer height 10" and second layer 20 has a second layer height 20" that are each smaller than third layer height 30".

Preferably, second electrode 21 and further second electrode 21' are each made self-supporting, i.e. second electrode 21 and/or further second electrode 21' has, parallel to normal direction 103, a first distance 25 from first electrode 11 or further first electrode 11', and a second distance 26 from third electrode 31 or further third electrode 31'. In particular, first distance 25 is essentially equal to second distance 26. Preferably, second electrode 21 and further second electrode 21' are connected both immovably and also in electrically conductive fashion to deflectable mass element 40, via a connecting means 43 or further connecting means 43'. Preferably, second electrode 21 has, in a rest position of deflectable element 40, a first region of overlap 23 with first electrode 11 along a direction of projection essentially parallel to the normal direction, and has a second region of overlap 24 with third electrode 31 along a further direction of projection parallel to the direction of projection. Preferably, the direction of projection is at a distance from the further direction of projection, parallel to the main plane of extension. In particular, region of overlap 23 is made point-symmetrical to second region of overlap 24 relative to a point of symmetry situated on an axis of symmetry 102' of second electrode 21, in particular axis of symmetry 202' dividing second electrode 21 into two mirror-symmetrical partial regions, and in particular being situated parallel to Y direction 102. In this way, it is advantageously possible to provide a compensating structure 11, 11', 21, 21', 31, 31', 41 that on average does not cause any basic deflection and that on average has symmetrical compensating forces 103', 103" in both orientations parallel to direction of detection 103.

Figure 7:
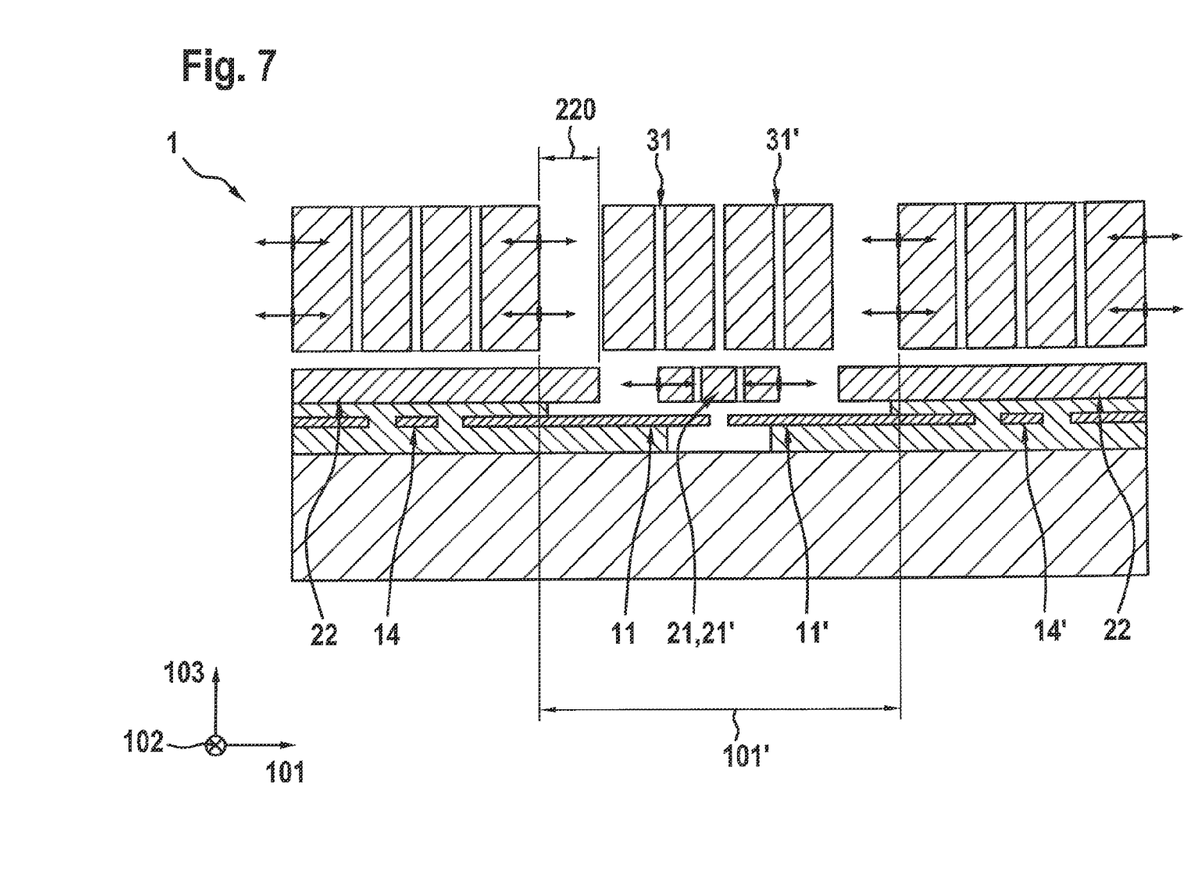

FIG. 7 shows a micromechanical component 1 according to a specific embodiment of the present invention, in a schematic side view. The specific embodiment shown here corresponds essentially to the specific embodiment described in FIG. 6, second electrode 21 and further second electrode 21' here forming a unit that is coupled immovably, and in particular being fashioned without connection to first layer 10. In this way, overall width 101' of quadrature compensation structure 11, 11', 21, 21', 31, 31', 41 is still further reduced. Here, second electrode 21 and further second electrode 21' are combined to form a single element, or unit 21, 21'. Corresponding to the changed overlap movement between the movable unit made up of second electrode 21 and further second electrode 21' on the one hand and first, or further first, electrode 11, 11' and third, or further third, electrode 31, 31' on the other hand, the controlling of the corresponding electrode pairs in this configuration takes place in crosswise fashion—i.e. first electrode 11 is connected electrically conductively to further third electrode 31', and further first electrode 11' is conducted electrically conductively to third electrode 31.

Figure 8:
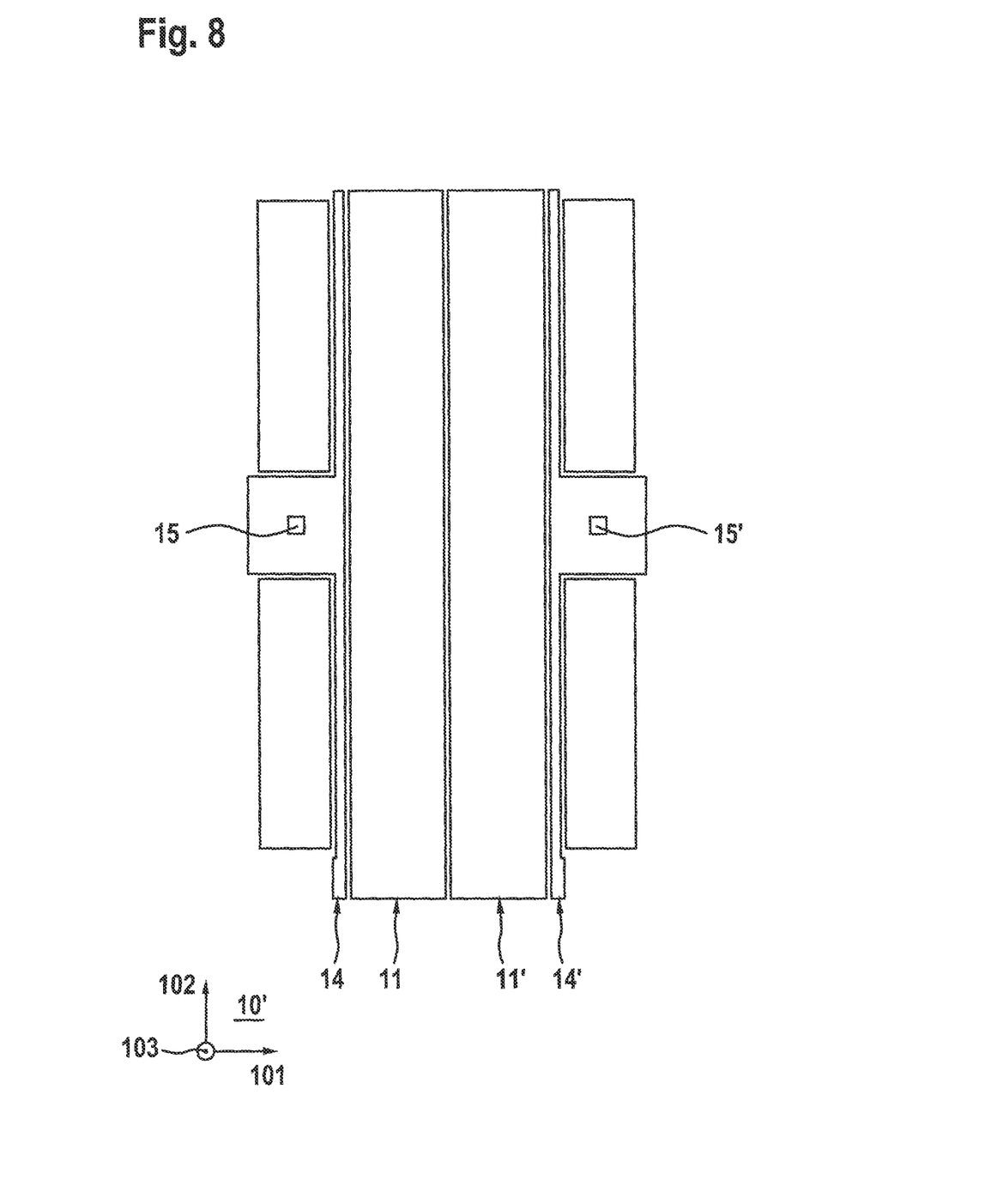
FIGS. 8 through 10 show a micromechanical component according to a specific embodiment of the present invention in various schematic top views.
Figure 9:
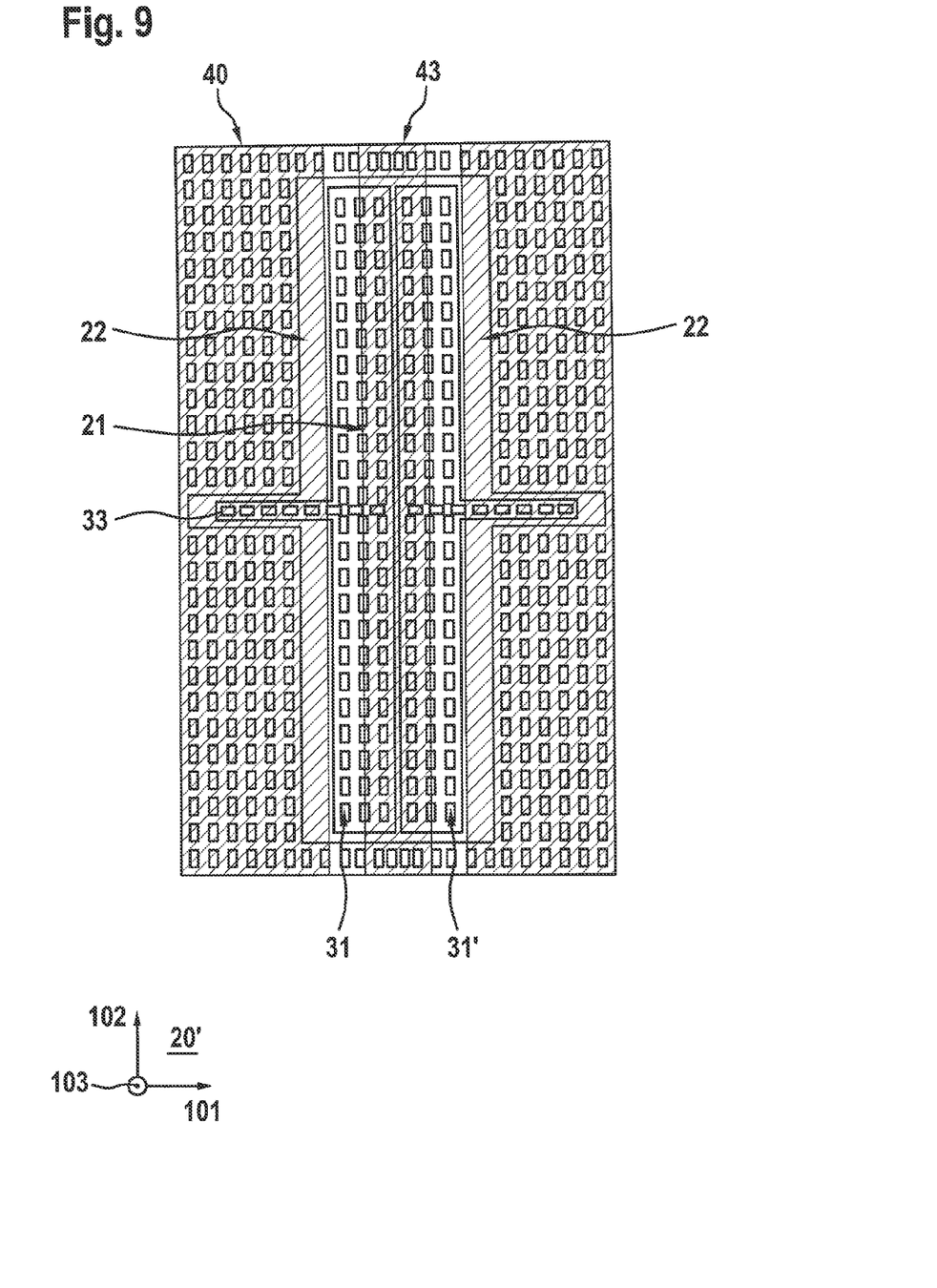
Figure 10:
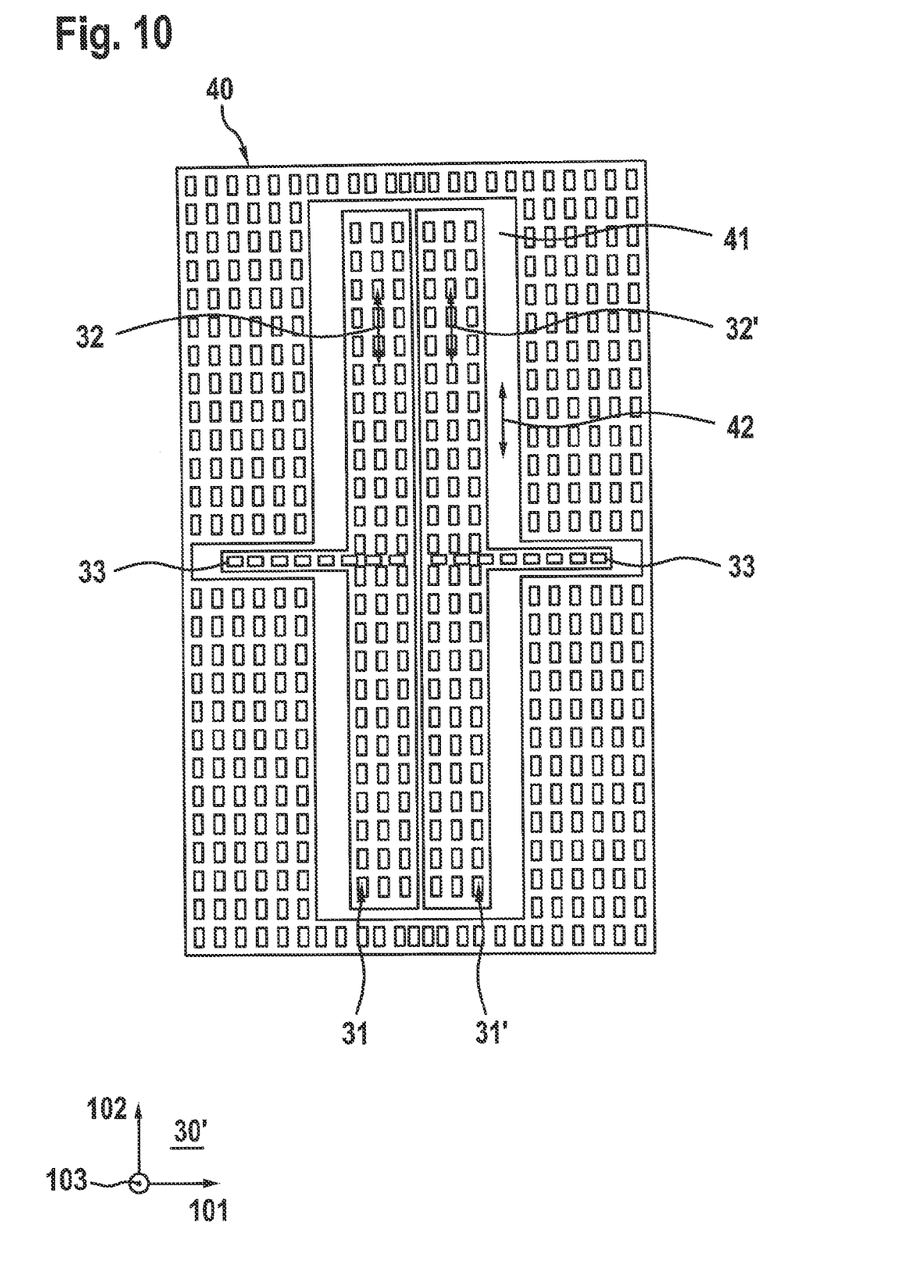

FIGS. 8 through 10 show a micromechanical component 1 according to a specific embodiment of the present invention in various schematic top views. FIG. 8 shows first layer 10 along first plane 10', first and further first electrode 11, 11', conductive means 14, 14' for producing an electrically conductive connection to further third or third electrode 31', 31, and a contact region 15 and further contact region 15 being situated in first plane 10'. An electrically conductive connection to the higher layers is produced via contact region 15 or further contact region 15'. In FIG. 9, second layer 20 is shown along second plane 20'. In FIG. 10, third and/or further third electrode 31, 31' is fashioned as a self-supporting bridge—i.e. a bridge situated over second electrode 21 or further second electrode 21' along a projection direction parallel to normal direction 103—and is connected to the substrate in stationary fashion, in particular only at a point, at a connection point 33 or further connection point 33'. In this way, it is advantageously possible to reduce the effective overall width 101' of the quadrature compensation structure comparatively strongly. Here, third electrode 31 has a main direction of extension designated electrode direction 32, and further electrode 31' has a main direction of extension designated further electrode direction 32'. In addition, recess 41 has a main direction of extension 42 that is situated both parallel to electrode direction 32 and also parallel to further electrode direction 32'.

Figure 11:
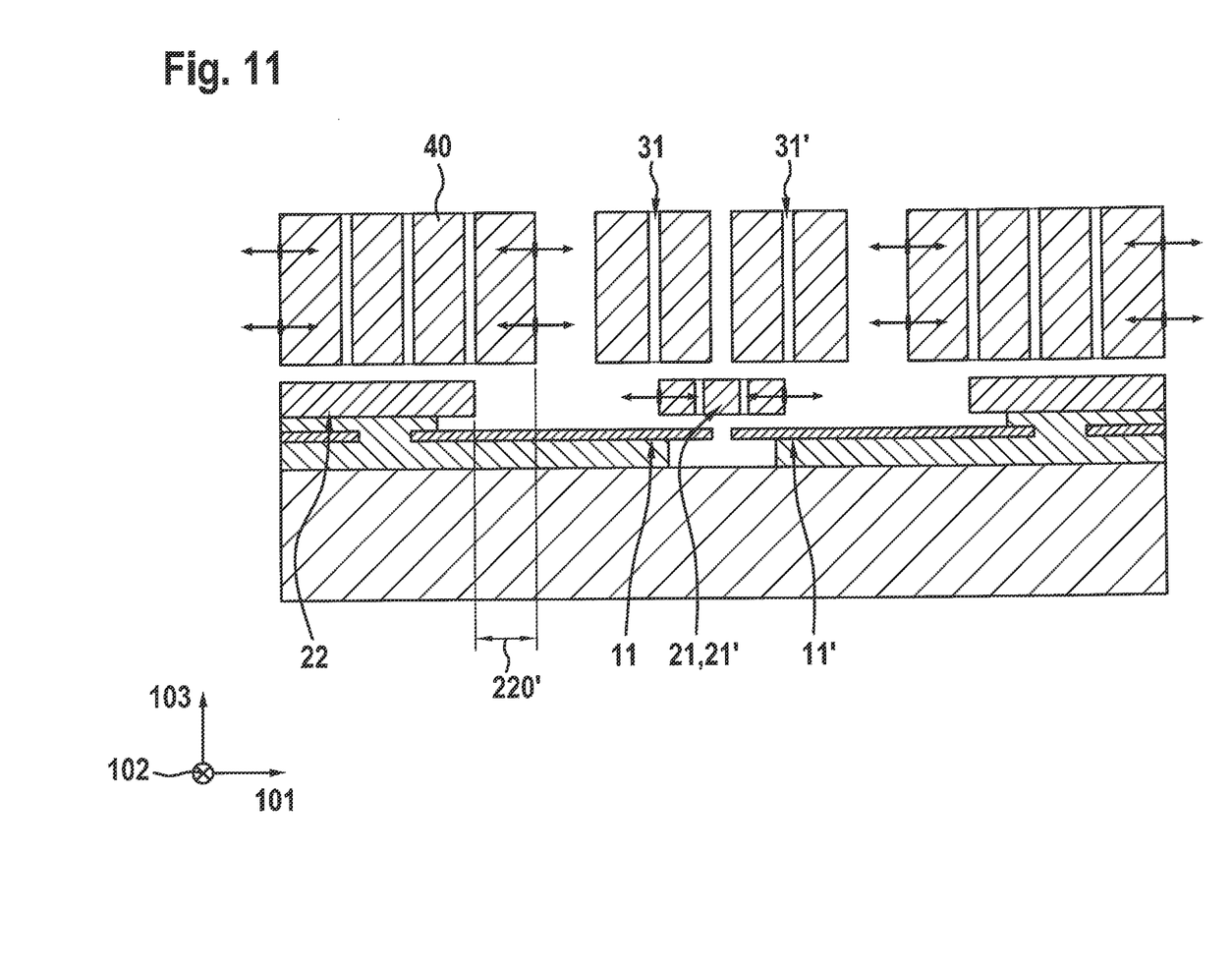
FIG. 11 shows a micromechanical component according to a specific embodiment of the present invention in a schematic sectional view.

FIG. 11 shows a micromechanical component 1 according to a specific embodiment of the present invention in a schematic sectional view. The specific embodiment shown here corresponds essentially to the specific embodiment shown in FIG. 7. The difference is that here detection electrode 22 is situated under deflectable mass 20, along X direction 101, in such a way that detection electrode 22 always overlaps completely with movable mass 40 during a deflection of deflectable element 40 parallel to X direction 101, along a direction of projection parallel to normal direction 103; here this is indicated by reference character 220'. This means that a detection signal produced as a function of a deflection of mass element 40 parallel to normal direction 103 is independent of a momentary deflection of the deflectable element parallel to X direction 101. According to the present invention, it is advantageous that given compensation electrodes 11, 31 or 11', 31' situated at both sides of mass element 40, detection electrode 22 overlaps with the first or further first electrode 11, 11' along a projection direction parallel to the normal direction, which is indicated in FIG. 7 by reference character 220. In this way, advantageously a detection signal is produced that is independent of the momentary deflection of mass element 40. In particular, in addition advantageously the detection capacitance is increased while the space requirement remains the same.

Figure 12:
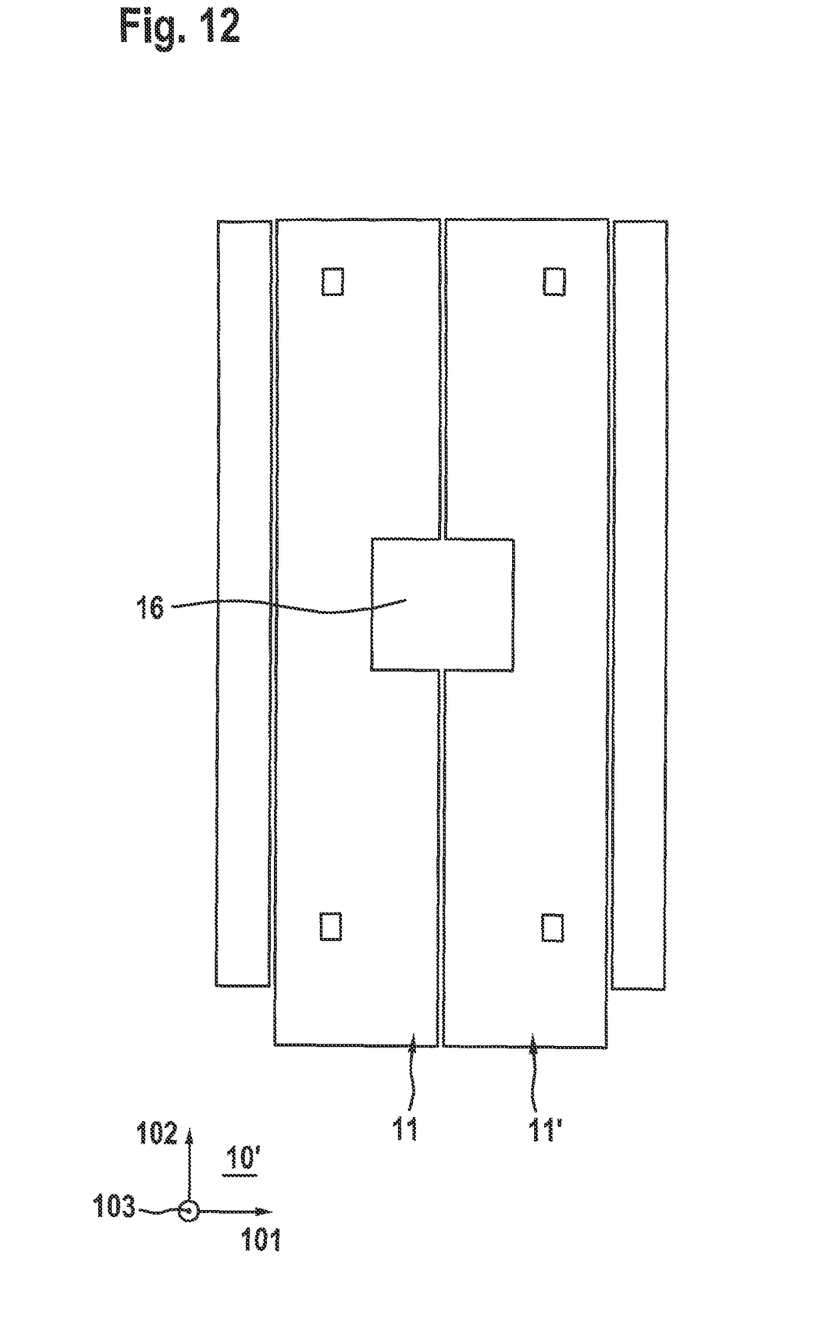
FIGS. 12 through 14 show a micromechanical component according to a specific embodiment of the present invention in various schematic top views.
Figure 13:
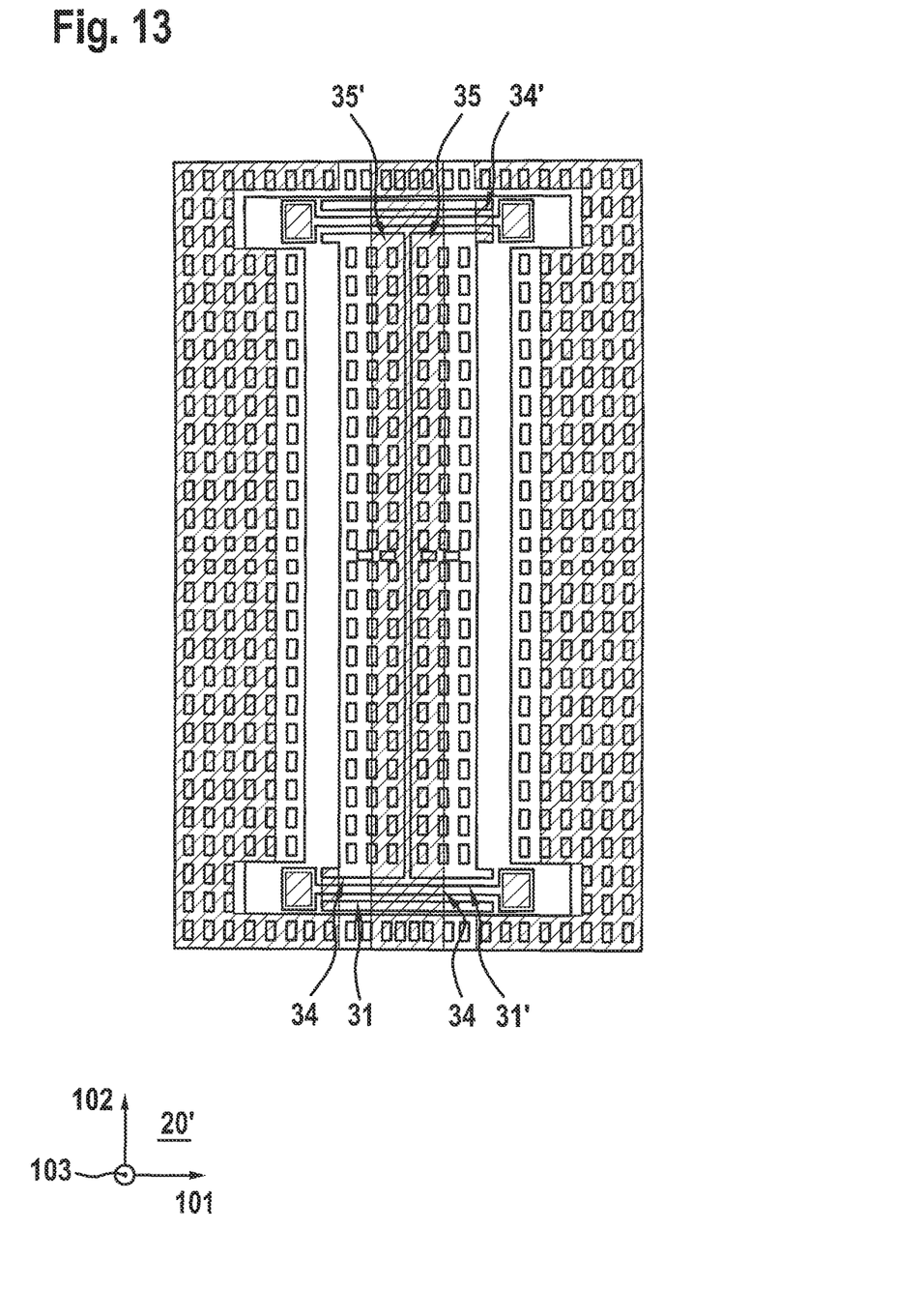
Figure 14:
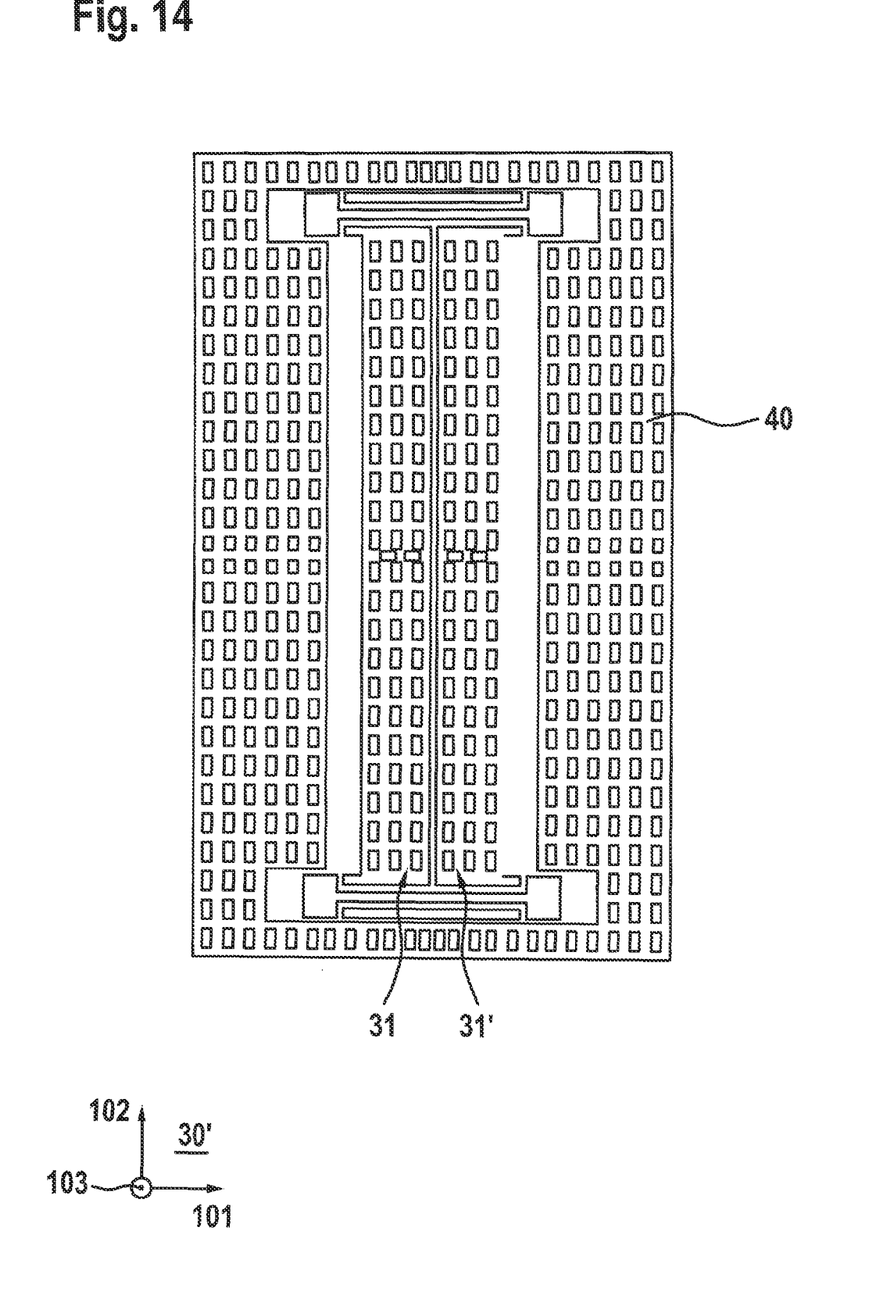

FIGS. 12 through 14 show a micromechanical component according to a specific embodiment of the present invention in various schematic top views. FIG. 12 shows the component along a section along first plane 10; here, first and further first electrode 11, 11' have an electrode recess 16 that is in particular an empty surface and in particular is fashioned in such a way that electrical effectively equal surface relations are created between lower electrodes 11, 11' and upper electrode 31, 31'. In addition, here third or further third electrode 31, 31', as well as movable second or further second electrode 21, 21', are fashioned as bridge structures suspended at both sides, shown for example in FIGS. 13 and 14. Here, further third electrode 31' is connected to first electrode 11, and third electrode 31 is connected to further first electrode 11', mechanically—i.e. in particular in stationary fashion—and/or in electrically conductive fashion in each case. Here a first electrically conductive connection is formed between third electrode 31 and further first electrode 11' by first bridge elements 34, 35 situated in third layer 30 or in third plane 30', bridging second or further second electrode 21, 21' or electrode unit 21, 21'. Here, first bridge elements 34, 35 are connected mechanically and/or electrically conductively to first electrode 11 situated in first plane 10'. Further third electrode 31' is connected in electrically conductive fashion to first electrode 11 via a second bridge element 34' that is situated in second plane 20' and is situated parallel to normal direction 103 between substrate 10 and first bridge element 35, and via a further second bridge element 35' that is connected in electrically conductive fashion to second bridge element 34' and is situated in third plane 30'. In particular, further second bridge element 35' bridges second or further second electrode 21, 21', or electrode unit 21, 21'. At an end situated opposite bridge elements 34', 35, 35' along Y direction 102, further third electrode 31' is connected, via a first bridge element 34, in stationary fashion to the substrate and is connected in electrically conductive fashion to first electrode 11. In this way, advantageously a separate electrical supply line can be saved.

What is claimed is:

1. A micromechanical component, comprising:
a substrate having a main plane of extension;
a first electrode extending mainly along a first plane in planar fashion;
a second electrode extending mainly along a second plane in planar fashion;
a third electrode extending mainly along a third plane in planar fashion, wherein the first, second, and third planes are oriented essentially parallel to the main plane of extension and are situated one over another at a distance from one another along a normal direction that is essentially perpendicular to the main plane of extension; and
a deflectable mass element capable of being deflected both essentially parallel and also essentially perpendicular to the main plane of extension, wherein:
the second electrode is connected immovably to the mass element,
the second electrode has, in a rest position, a first region of overlap with the first electrode along a projection direction essentially parallel to the normal direction, and having a second region of overlap with the third electrode along a further projection direction parallel to the projection direction, the mass element extends in planar fashion mainly along the third plane, the mass element includes a recess that extends completely through the mass element and extends in planar fashion along the third plane and parallel to the normal direction, and the third electrode is situated at least partly in the recess.

2. The micromechanical component as recited in claim 1, wherein:

the second electrode has, parallel to the normal direction, a first distance from the first electrode and a second distance from the third electrode, and the first distance and the second distance are essentially equally large.

3. The micromechanical component as recited in claim 1, wherein the second electrode is made self-supporting.

4. The micromechanical component as recited in claim 1, wherein the first region of overlap and the second region of overlap are at least one of:

equally large, situated alongside one another along the direction of projection parallel to the normal direction, and mirror-symmetrical relative to an axis of symmetry extending essentially parallel to the second plane.

5. The micromechanical component as recited in claim 1, further comprising:

a first layer applied on the substrate and including the first electrode;

a second layer applied on the first layer and including the second electrode; and a third layer applied on the second layer and including the third electrode, the mass element, the recess, and the third electrode being formed one of at least partially and completely from the same third layer.

6. The micromechanical component as recited in claim 1, wherein:

the first electrode and the third electrode are connected in stationary fashion to the substrate, the recess has a main direction of extension, and the third electrode extends in oblong fashion mainly along an electrode direction parallel to the main direction of extension inside the recess.

7. The micromechanical component as recited in claim 1, further comprising:

a further first electrode; and a further third electrode, wherein:

the first electrode and the further first electrode are situated alongside one another and electrically insulated from one another along the direction of projection parallel to the normal direction, the third electrode and further third electrode are situated alongside one another and electrically insulated from one another along the direction of projection parallel to the normal direction, and the further third electrode extends in oblong fashion mainly along a further electrode direction essentially parallel to the electrode direction inside the recess.

8. The micromechanical component as recited in claim 1, further comprising:

a detection electrode that extends in planar fashion mainly along the second plane, wherein:

the detection electrode is configured for a capacitive detection of a deflection of the mass element along the normal direction, and the first electrode is situated at least partly between the detection electrode and the substrate, along the direction of projection parallel to the normal direction.

9. The micromechanical component as recited in claim 5, wherein:

the third layer has a third layer height extending parallel to the normal direction, and at least one of the mass element, the recess, and the third electrode extends parallel to the normal direction along a height essentially equal to the third layer height.

10. The micromechanical component as recited in claim 1, wherein:

the first electrode and the third electrode are quadrature compensation electrodes, the first electrode is configured to produce a compensating force acting on the second electrode essentially in a direction of the first electrode, and the third electrode is configured to produce a further compensating force acting on the second electrode essentially in a direction of the third electrode.

11. A method for producing a micromechanical component that includes a substrate having a main plane of extension, comprising:

applying a first layer on the substrate in a first production step;

forming a first electrode in the first layer that extends in planar fashion mainly along a first plane essentially parallel to the main plane of extension;

applying a second layer on the first layer in a second production step;

forming a second electrode in the second layer that extends in planar fashion mainly along a second plane essentially parallel to the first plane;

applying a third layer on the second layer in a third production step;

forming a third electrode one of at least partly and completely in the third layer that extends in planar fashion along a third plane essentially parallel to the second plane;

forming a mass element one of at least partly and completely in the third layer that extends in planar fashion mainly along the third plane essentially parallel to the second plane;

connecting the mass element immovably to the second electrode;

forming a recess in the mass element that extends completely through the mass element along a direction of projection essentially perpendicular to the main plane of extension;

situating the third electrode one of at least partly and completely in the recess of the mass element; and connecting the third electrode in stationary fashion to the substrate, the second electrode, the mass element, and the third electrode being underetched one of at least partly and completely in a fourth production step.

12. The method as recited in claim 11, wherein in the third production step the third layer is structured in such a way that the third layer has a third layer height extending parallel to the normal direction, and wherein at least one of the mass element, the recess, and the third electrode extends along a height essentially equal to the layer height.

* * * * *